United States Patent

Liu et al.

[11] Patent Number: 5,948,572
[45] Date of Patent: Sep. 7, 1999

[54] MIXED MODE PHOTOMASK FOR NIKON STEPPER

[75] Inventors: Chih-Chiang Liu; Kuo-Cheng Chuan, both of Hsinchu, Taiwan

[73] Assignee: United Microelectronics Corp., Hsin-Chu, Taiwan

[21] Appl. No.: 09/008,862

[22] Filed: Jan. 20, 1998

[30] Foreign Application Priority Data

Nov. 26, 1997 [TW] Taiwan ................................. 86117759

[51] Int. Cl.⁶ .......................................................... G03F 9/00
[52] U.S. Cl. .................................................. 430/5; 430/22
[58] Field of Search .......................... 430/5, 22; 356/399, 356/401

[56] References Cited

U.S. PATENT DOCUMENTS 5,837,404   11/1998   Lu ............................................. 430/22

*Primary Examiner*—S. Rosasco
*Attorney, Agent, or Firm*—Rabin & Champagne, P.C.

[57] ABSTRACT

A mixed mode photo-mask for a stepper. Both alignment marks of 15 mm×15 mm and alignment marks of 20 mm×20 mm are tooled on the photo mask. The photo mask further comprises a reticle glass plate, a chrome border with a pattern to be transferred, and a pellicle.

14 Claims, 2 Drawing Sheets

MIXED MODE PHOTOMASK FOR NIKON STEPPER

CROSS-REFERENCE TO RELATED APPLICATION

This application claims the priority benefit of Taiwan application serial no. 86117759, filed Nov. 26, 1997, the full disclosure of which is incorporated herein by reference.

BACKGROUND OF THE INVENTION

1. Field of the Invention

The invention relates to a photo-mask for a stepper, and more particularly to a five inch photo mask, on which a set of four 15 mm×15 mm alignment marks of and a set of four 20 mm×20 mm alignment marks are both tooled, suitably used for a NIKON stepper for mix-match production of G-line and an I-line.

2. Description of the Related Art

Integration circuits (ICs) have reached every part of our daily lives. However, the process of fabricating an IC is very complex. Hundreds of steps are needed for making an IC. The fabrication normally takes one or two month to complete. The IC industry is a high technology industry which includes four main branches: IC design, wafer fabrication, wafer testing, and wafer packaging. Thus, the IC industry is not only an advanced technology industry, but also a high risk industry which needs tremendous capital to maintain.

For wafer fabrication, processes such as oxidation, diffusion, deposition, patterning, and etching, are further included. While exposing the photo-resist layer on the surface for patterning a wafer, in addition to a light source, a photo mask for transferring the pattern is necessary.

The main body of a photo mask is a flat and transparent glass plate. Patterns of semiconductors are indicated by a chrome border having a thickness of hundreds of angstroms, coated on the glass. Sometimes, a chromium oxide layer of thickness 200 Å is further formed on the chrome border for the purpose of anti-reflection. For a normal process of forming a device, 10 to 18 photo masks are used. In every step of exposure, an alignment is necessary to obtain a precise pattern. Otherwise, a device failure is caused due to improper pattern transfer.

There are three conventional techniques for exposing photo-resist, including technique respectively of a contact type, a proximity type, and a projection type. For the projection type exposure technique, the characteristic most different from those of the former two types is that the photo mask does not contact, nor is it proximate with the device. The advantage of this characteristic is that the pattern on the photo mask is not damaged by contact during pattern transfer, and good resolution can be achieved. A more advanced projection-type exposure technique is the "step and repeat" exposure, whereby the resolution is further enhanced. The equipment used for this technique is called a "stepper".

In a photolithography process used for commercial production, a stepper is used to transfer a pattern. However, the stepper is not without problems. The main problem is that, for commercial mass production, tens of exposure processes are required. Thus, the yield is reduced as the fabricating time increases. The more frequently used light sources are a G line source and an I-line source. The G line source (G4/G61G7) is a source of ultra-violet light having a wavelength of 4360 Å, and the I line source (I8/I9) is a source of ultra-violet light having a wavelength of 365 Å.

Referring to FIG. 1, a layout of a photo mask with four 15 mm×15 mm alignment marks is shown. The photo mask comprises a 5 inch-square reticle glass plate 10 and a chrome border 20 coated on the reticle glass plate 10. The pattern to be transferred is indicated by the chrome border 20. The four alignment marks, illustrated as a first alignment mark 25, a second alignment mark 30, a third alignment mark 35, and a fourth alignment mark 40 are tooled along the respective four sides of the chrome border 20. A thin pellicle frame 15 is coated on the chrome border 20 to protect the surface of the photo mask from being contaminated by particles or granules. The dimension of the pellicle frame 15 is 120 mm×98 mm.

Applying a conventional photo-mask with a set of four 15 mm×15 mm alignment marks to an 18 or 19 stepper for exposure, an extra machine test is needed to ensure the accuracy of the process. The extra machine test takes about 2 hours per set to complete. In case that the 18 or 19 stepper is abnormal, after resetting the stepper, without performing the extra machine test, a device failure may occur. A normal mass production yield can not be obtained, and a flexibility of production is poor.

SUMMARY OF THE INVENTION

It is therefore an object of the invention to provide a 5-inch-square photo mask on which a set of four 15 mm×15 mm alignment marks and a set of three 20 mm×20 mm alignment marks are both tooled. Therefore, the operating mode can be switched as desired. The fabricating time is reduced, and a normal throughput by using a NIKON stepper is obtained.

To achieve these objects and advantages, and in accordance with the purpose of the invention, as embodied and broadly described herein, the invention is directed toward a photo mask for a NIKON stepper. A mixed mode photo mask for a NIKON stepper suitable for applying to a mixed mode production comprises a reticle glass plate which has a first alignment mark, a second alignment mark, a third alignment mark, and a fourth alignment mark tooled on each side, a central point located at a central position of the reticle glass, a chrome border formed on the reticle glass plate, and a pellicle covering the chrome border and comprising a first lengthwise side, a first widthwise side, a second lengthwise side, and a second widthwise side. On the pellicle, a fifth alignment mark is tooled between the first lengthwise side and the reticle glass, a sixth alignment mark is tooled between the first widthwise side and the reticle glass plate, and a seventh alignment mark is tooled between the second lengthwise side and the reticle glass plate.

It is to be understood that both the foregoing general description and the following detailed description are exemplary and explanatory only and are not restrictive of the invention, as claimed.

DESCRIPTION OF THE PREFERRED EMBODIMENTS

Figure 1:
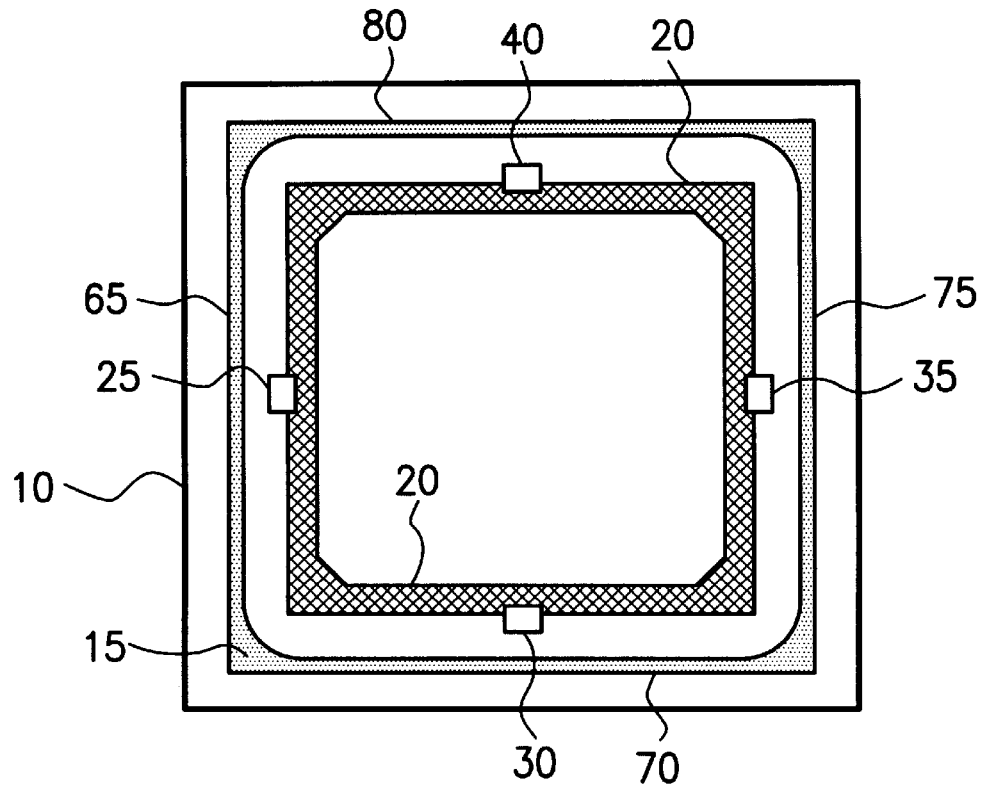
FIG. 1 shows the layout of a photo-mask with a set of four 15 mm×15 mm alignment mark.
Figure 2:
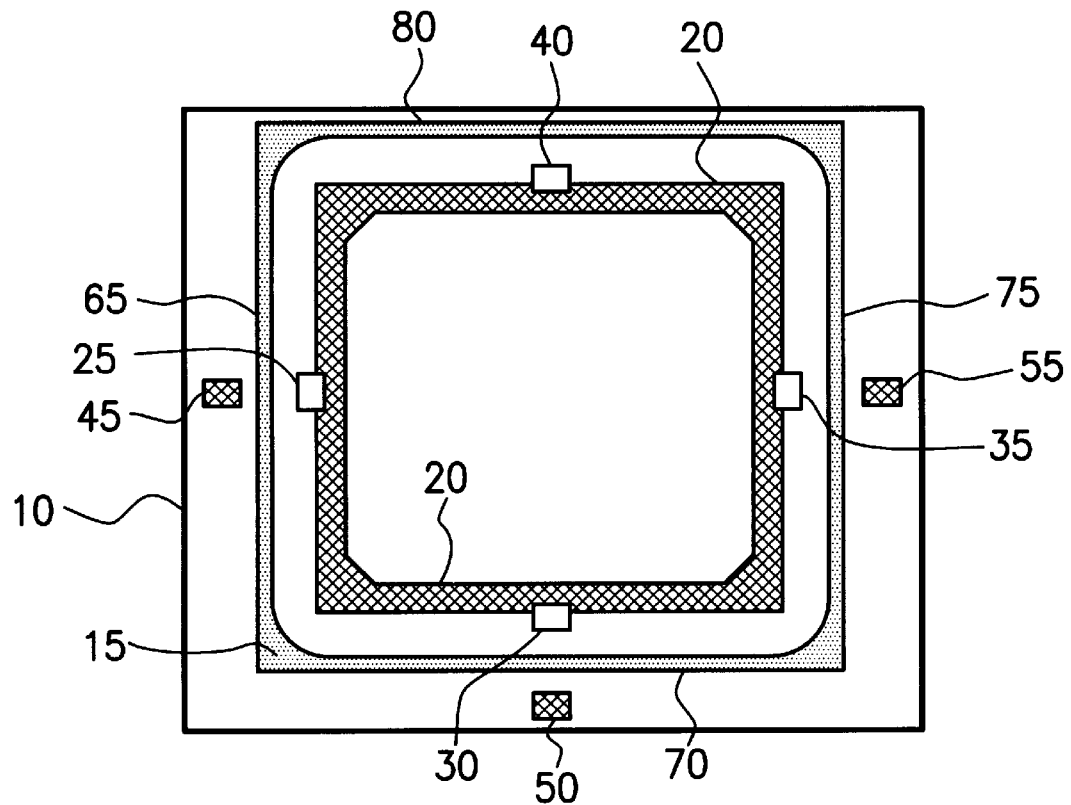
FIG. 2 shows the layout of a photo-mask with both a set of four 15 mm×15 mm alignment marks and set of four 20 mm×20 mm alignment marks.

Referring to FIG. 2, the layout of a photo mask with both 15 mm×15 mm alignment marks and 20 mm×20 mm alignment marks is shown. On a five inch reticle glass 10, a chrome border is coated. Each of four alignment marks, noted as the first alignment mark 25, the second alignment mark 30, the third alignment mark 35, and the fourth alignment mark 40, is tooled along each side of the chrome border 20, respectively. A pellicle 15 is formed on the chrome border. The pellicle 15 comprises a first lengthwise side 65, a first widthwise side 70, a second lengthwise side 75, and a second widthwise side 80. A fifth alignment mark 45 is tooled between the first lengthwise side 65 and a side of the glass plate 10 parallel and closest to the first lengthwise side 65. A sixth alignment mark 50 is tooled between the first widthwise side 70 and a side of the glass plate 10 parallel and closest to the first widthwise side 70. A seventh alignment mark 55 is tooled between the second lengthwise side 75 and a side of the glass plate 10 parallel and closest to the second lengthwise side 75. The dimensions of each of the first alignment mark 25, the second alignment mark 30, the third alignment mark 35, and the fourth alignment mark 40 is 15 mm×15 mm. The dimension of the fifth alignment mark 45, the sixth alignment mark 50, and the dimensions of the seventh alignment mark 55 are 20 mm×20 mm.

Figure 3:
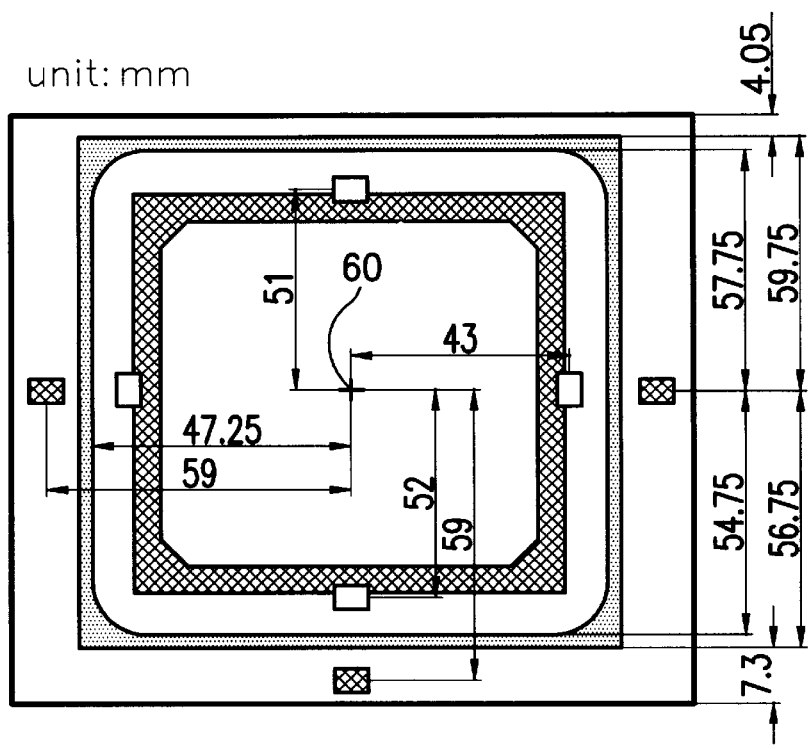
FIG. 3 shows the configuration of a photo mask with both a set of four 15 mm×15 mm alignment marks and a set of three 20 mm×20 mm alignment marks.
Figure 4:
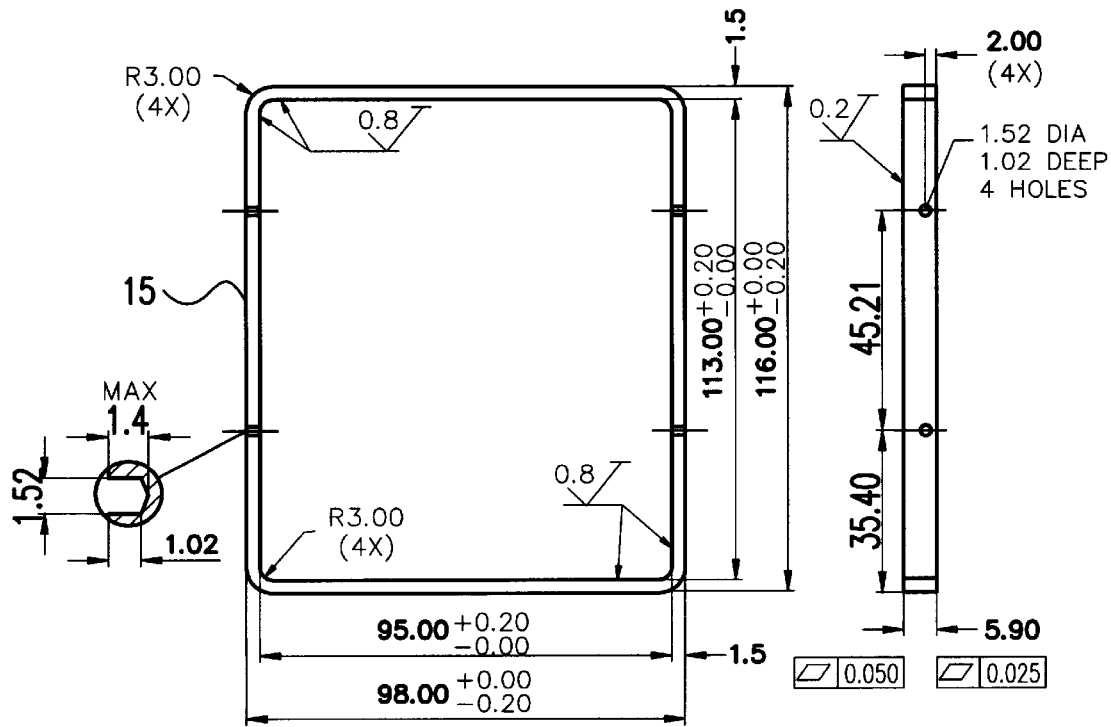
FIG. 4 shows the configuration of a pellicle in a preferred embodiment according to the invention.

Referring to FIG. 3 and FIG. 4, the layout and configuration of a photo mask with both the 15 mm×15 mm alignment marks and the 20 mm×20 mm alignment marks are shown. Comparing these to the conventional photo mask introduced above, the dimensions of the pellicle 15 is altered to the 116×98 mm, and the pellicle 15 is closest to the second widthwise side 80 of the glass 10.

Moreover, in the illustrated embodiment, the distances from the following locations to a central point 60 of the pellicle 15 are:

43 mm from the first alignment mark 25, or the third alignment mark 35 to the central point 60;

52 mm from the second alignment mark 30 to the central point 60;

51 mm from the fourth alignment mark 40 to the central point 60;

59 mm from the fifth alignment mark 45, the sixth alignment mark 50, or the seven alignment mark 55 to the central point 60;

47.25 mm from the first lengthwise side 65, or the second lengthwise side 75 to the central point 60;

54.75 mm from the first widthwise side 70 to the central point 60;

57.75 mm from the second widthwise side 80 to the central point 60;

4.05 mm from the first widthwise side 70 to the side of the glass 10 parallel and closest to the first widthwise side 70; and 7.3 mm from the second widthwise side 80 to the side of the glass 10 parallel and closest to the second widthwise side 80 is 7.3 mm. The thickness of the pellicle 15 is 1.5 mm.

In the invention, a photo-mask for a NIKON stepper is improved. Both alignment marks of dimensions 15 mm×15 mm and alignment marks of dimensions 20 mm×20 mm are tooled on a 5-inch-square photo-mask. Therefore, the same photo mask can be applied to (used with) both a G-line stepper (G4/G6/G7) and an I-line (18/19) stepper, without performing an extra machine test.

Moreover, in the invention, the operating mode can be switch as desired. Thus, the photo-mask is suitable for the application in a mixed production of G-line and I-line, for example, a 0.6 μm G/I mix-match and all the G-line production. While switching G/I line production, high production flexibility is achieved without retooling a photo mask.

Other embodiment of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A mixed-mode photomask for a NIKON stepper, suitable for application to mixed-mode production, comprising:

a reticle glass plate, comprising a set of four alignment marks including a first alignment mark, a second alignment mark, a third alignment mark, and a fourth alignment mark tooled on each side of the reticle glass plate, wherein the first alignment mark, the second alignment mark, the third alignment mark, and the fourth alignment mark are for use with a first stepper having a first light source;

a chrome border, formed on the reticle glass plate; and a pellicle, covering the chrome border and comprising a first lengthwise side, a first widthwise side, a second lengthwise side, and a second widthwise side;

wherein a set of three alignment marks for a second stepper having a second light source different than the first light source is tooled on the pellicle, the set of three alignment marks including a fifth alignment mark, tooled on the pellicle between the first lengthwise side and the reticle glass plate, a sixth alignment mark, tooled on the pellicle between the first widthwise side and the reticle glass plate, and a seventh alignment mark, tooled on the pellicle between the second lengthwise side and the reticle glass plate.

2. A photomask according to claim 1, wherein the reticle glass plate is a five-inch-square glass plate.

3. A photomask according to claim 1, wherein a pattern to be transferred is indicated by the chrome border.

4. A photomask according to claim 1, wherein the first alignment mark, the second alignment mark, the third align mark, and the fourth align mark are 15 mm×15 mm align marks.

5. A photomask according to claim 1, wherein the pellicle has dimensions 116 mm×98 mm.

6. A photomask according to claim 1, wherein the pellicle has a thickness of 1.5 mm.

7. A photomask according to claim 1, wherein the fifth alignment mark, the sixth alignment mark, and the seven alignment mark are 20 mm×20 mm alignment marks.

8. A photomask according to claim 1, wherein the pellicle is closest to the second widthwise side of the glass plate.

9. A photomask according to claim 1, wherein a distance from each alignment mark to a central point, located at a central position of the reticle glass plate, is:

43 mm from the first alignment mark to the central point;

43 mm from the third alignment mark to the central point is 43 mm;

52 mm from the second alignment mark to the central point;

51 mm from the fourth alignment mark to the central point;

59 mm from the fifth alignment mark to the central point;

59 mm from the sixth alignment mark to the central point;

59 mm from the seventh alignment mark to the central point;

47.25 mm from the first lengthwise side to the central point;

47.25 mm from the second lengthwise side to the central point;

54.75 mm from the first widthwise side to the central point;

57.75 mm from the second widthwise side to the central point;

4.05 mm from the first widthwise side to the side of the glass plate parallel and closest to the first widthwise side; and 7.3 mm from the second widthwise side to the side of the glass plate parallel and closest to the second widthwise side is 7.3 mm.

10. A photomask according to claim 1, wherein the first stepper is an I-line stepper.

11. A photomask according to claim 1, wherein the second stepper is a G-line stepper.

12. A mixed-mode photomask for a NIKON stepper, suitable for application to mixed-mode production, comprising:

a four-sided reticle glass plate having tooled on the respective four sides thereof a set of four alignment marks for a stepper having a light source of a first wavelength, the set of four alignment marks including a first alignment mark, a second alignment mark, a third alignment mark, and a fourth alignment mark;

a chrome border, formed on the reticle glass plate;

a pellicle, covering the chrome border and having a first lengthwise side, a first widthwise side, a second lengthwise side, and a second widthwise side, the pellicle having a set of three alignment marks for a stepper having a light source of a second wavelength different than the first wavelength, the set of three alignment marks including a fifth alignment mark, tooled on the pellicle between the first lengthwise side and the reticle glass plate, a sixth alignment mark, tooled on the pellicle between the first widthwise side and the reticle glass plate, and a seventh alignment mark, tooled on the pellicle between the second lengthwise side and the reticle glass plate.

13. A photomask according to claim 12, wherein the stepper having the light source of the first wavelength is an I-line stepper.

14. A photomask according to claim 12, wherein the stepper having the light source of the second wavelength is a G-line stepper.

* * * * *